United States Patent [19]

Cabaniss et al.

[11] Patent Number: 4,695,808
[45] Date of Patent: Sep. 22, 1987

[54] VARYING FREQUENCY OSCILLATOR FOR THE REDUCTION OF RADIATED EMISSIONS OF ELECTRONIC EQUIPMENT

[75] Inventors: Frank W. Cabaniss, Columbia, S.C.; James M. Lockwood, Mountain View, Calif.

[73] Assignee: NCR Corporation, Dayton, Ohio

[21] Appl. No.: 584,269

[22] Filed: Feb. 27, 1984

[51] Int. Cl.$^4$ .............................................. H03B 1/00
[52] U.S. Cl. .................................. 331/57; 331/177 R; 332/18
[58] Field of Search ............... 331/57, 177 R; 332/18; 307/269, 590, 603, 604, 606

[56] References Cited

U.S. PATENT DOCUMENTS 4,079,338  3/1978  Kronlage ..................... 331/177 R X

FOREIGN PATENT DOCUMENTS

WO82/00930  3/1982  PCT Int'l Appl. ................. 307/603
1090760  11/1967  United Kingdom .................. 332/18

Primary Examiner—Eugene R. LaRoche
Assistant Examiner—Robert J. Pascal
Attorney, Agent, or Firm—Wilbert Hawk, Jr.; Richard W. Lavin

[57] ABSTRACT

An oscillator circuit for outputting clock signals of varying frequency which reduces interference caused by electromagnetic radiation from clock control systems includes a resistor-capacitor network for outputting a delay signal which delays the generation of clock signals by the oscillator by a predetermined time period and modulating the delay signal with an analog signal enabling the oscillator to output clock signals of varying frequency.

5 Claims, 4 Drawing Figures

VARYING FREQUENCY OSCILLATOR FOR THE REDUCTION OF RADIATED EMISSIONS OF ELECTRONIC EQUIPMENT

BACKGROUND OF THE INVENTION

The invention relates to clock control systems and more particularly to a method and apparatus for reducing interference caused by electromagnetic radiation.

In present-day data processing systems, clock control processors are utilized in which clock generated timing signals are used for synchronizing the operation of the processor. The clock generator generally comprises some form of oscillator for generating clock signals of a predetermined frequency. Electromagnetic radiation such as radio frequency emissions are generated from the constant frequency clock signals and their harmonics as well as repetitive signals and their harmonics. Because the emissions are the result of constant frequency clock signals, spikes of radio frequency emissions are generated at regular intervals throughout the frequency spectrum as well as other spikes of less predictable frequency and reduced amplitude.

To reduce the electromagnetic radiation level produced by the clock timing signals, prior methods have included the use of shielding the system equipment, and the use of conductive enclosures, conductive gasketing and shield cables. Such techniques work on containing the signals within the system cabinetry rather than reducing the amplitude of the radio frequency emission signals directly. Where methods have been employed to reduce the signal amplitude, they have been directed to frequency modulating of the clock signal. Examples of this type of signal reduction can be found in U.S. Pat. Nos. 2,352,254 and 3,388,349 in which the system clock signals are modulated by a low frequency signal. Because the signals within most computing systems are defined to be at TTL levels, there is a limit as to how much reduction in the signal swing can be tolerated before the system ceases to work properly.

Accordingly, it is an object of this invention to provide a new and improved method for reducing interference caused by electromagnetic radiation from clock control systems.

It is a further object of this invention to reduce interference caused by electromagnetic radiation without shielding the system equipment. It is another object of this invention to reduce electromagnetic radiation by a method which is simple and economical and which overcomes the disadvantages of prior known methods.

SUMMARY OF THE INVENTION

These and other objects of the invention are accomplished by providing a circuit which varies the frequency of the output of an oscillator which supplies system clock signals to a computing system. The circuitry includes a triangular wave generator which together with a resistor produces an analog signal which continuously varies the charging rate of a capacitor whose output varies the frequency of the clock signals.

BRIEF DESCRIPTION OF THE DRAWINGS

The foregoing and various other objects, advantages and meritorious features of the present invention will be apparent from the following detailed description and appended claims when read in conjunction with the drawings, wherein like numerals identify corresponding elements.

DESCRIPTION OF THE PREFERRED EMBODIMENT

Figure 1:
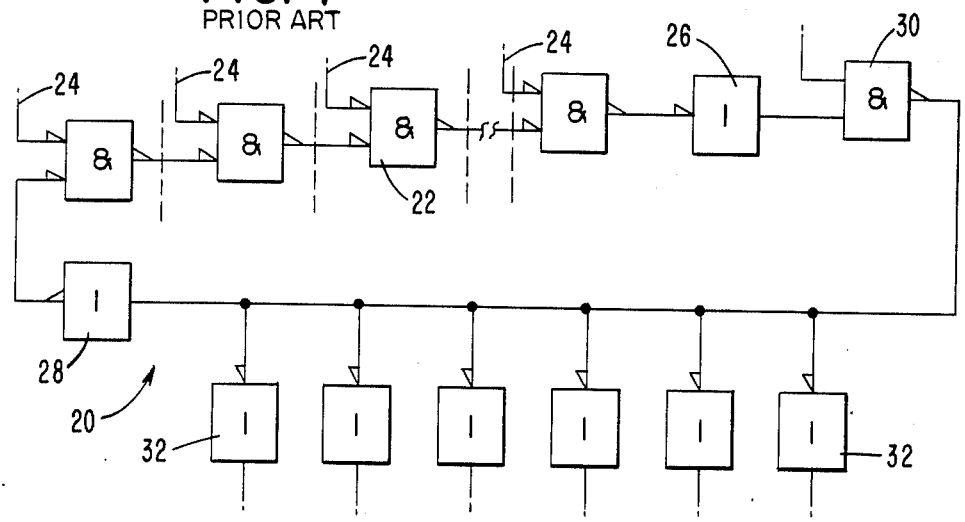
FIG. 1 is a schematic diagram of a conventional ring oscillator for generating clock signals which produce objectionable radiation frequency emissions.

Referring now to FIG. 1, there is shown a diagram of a standard free-running ring oscillator which is a source of clock signals used in data processing systems. Such oscillator, indicated generally by the numeral 20, includes a plurality of OR gates 22 each coupled in serial fashion over line 24 to a bus control unit (not shown) which controls the transfer of data on the system bus for portions of the processor, and which transfer requires that the operation of the oscillator 20 be suspended. In such a case, a high signal will appear on the line 24 for disabling the operation of the OR gate 22. The oscillator 20 is composed of the OR gates 22, inverter circuits 26 and 28 and the NAND gate 30. The clock output of the oscillator is tapped through a series of inverter gates 32 each of which outputs the clock signals to various portions of the processor or to peripheral devices associated with the processor. The oscillator 20 is of the free-running type which includes a delay as the clock pulses are propagated through the OR gates and an odd number of the inverter gates and which oscillator 20 will oscillate at an overall cycle time which is approximately twice the total delay time of the circuit. The cumulative capacitance of the inverters 32 constitute a substantial load on the oscillator 20, requiring a relatively high driving current which results in the radiation of relatively high amplitude signals at a 10–12 MHz. frequency together with their harmonics, and which signals may exceed FCC standards on permissible radiation by such signals.

Figure 4:
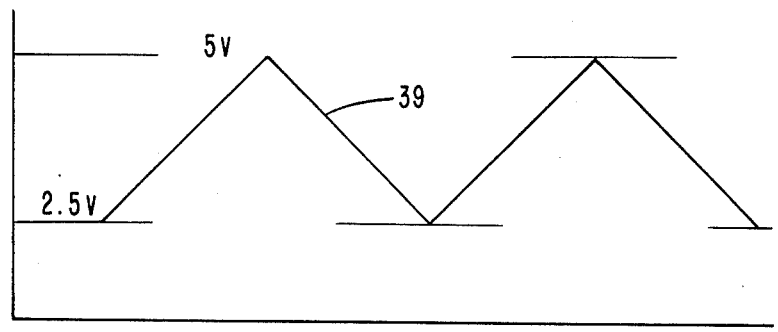
FIG. 4 is a representation of the analog waveform outputted by the triangular wave generator.

In order to overcome this problem, the present invention introduces a varying delay circuit 34 (FIG. 2) in the oscillator 20, which includes a delay circuit 36 and a triangular wave generator 38 which provides an analog control signal 39 (FIG. 4) for use in varying the delay of the clock signals as they are propagated around the oscillator, thereby enabling the oscillator 20 to output clock signals at a constantly varying frequency of between 10 and 12 MHz. By varying the frequency of the clock signals, the radiated energy is spread over a wider frequency band and the peak values of the RF emissions associated with the clock signals are significantly reduced enabling the system to meet the FCC regulations.

Figure 2:
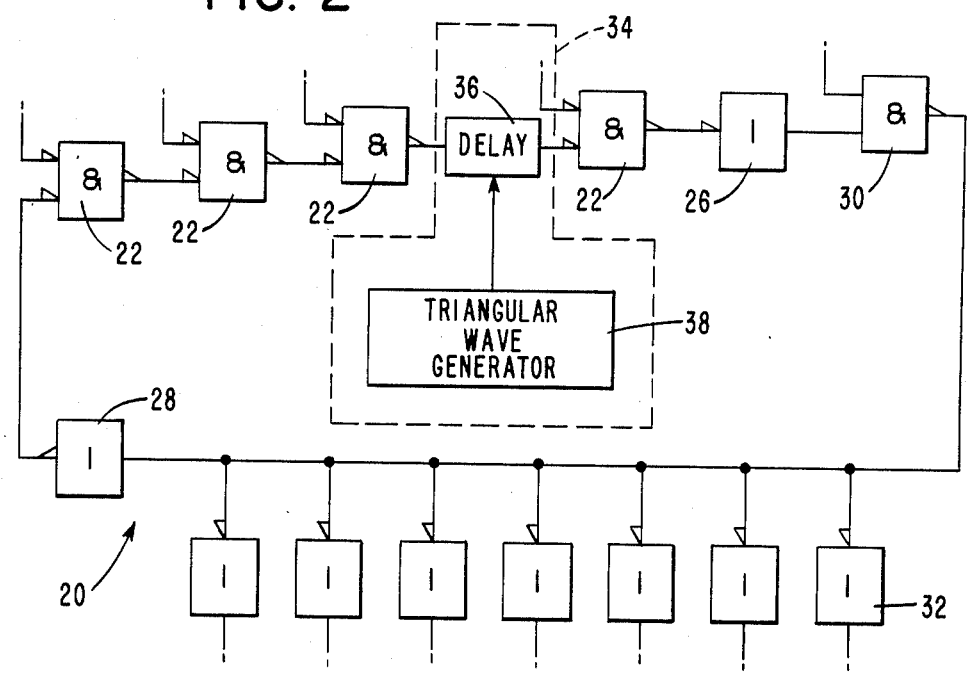
FIG. 2 is a schematic diagram of the oscillator of FIG. 1 which includes a varying delay circuit constructed in accordance with the present invention.
Figure 3:
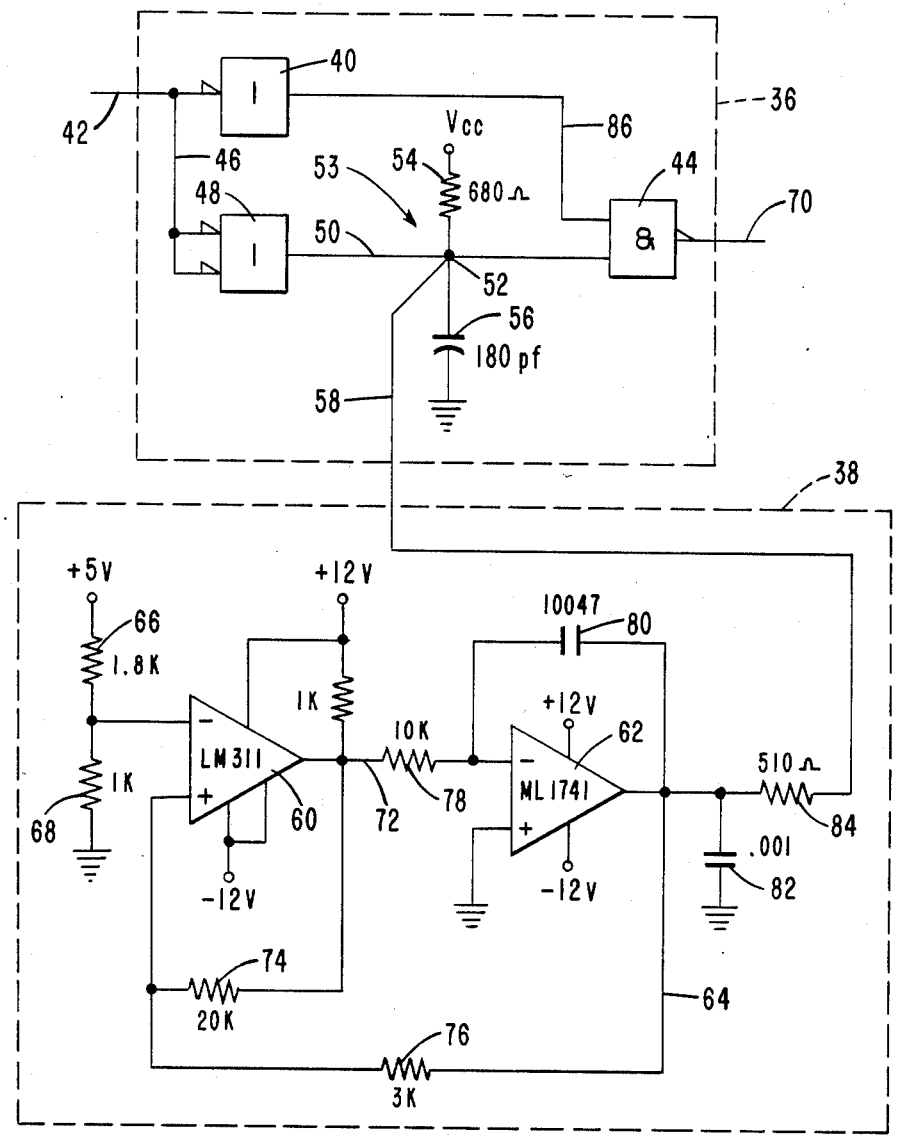
FIG. 3 is a schematic diagram of the varying delay circuit of the present invention showing details of the triangular wave generator and the delay circuit used in the present invention.

Referring now to FIG. 3, there is shown a schematic diagram of the delay circuit 36 and the triangular wave generator 38 of FIG. 2. The delay circuit includes a 74S04 inverter 40 which inverts the clock signals appearing on the input line 42 and outputted by the OR gates 22, which signals are inputted over line 86 and into a 74S132 Schmitt trigger circuit 44. The clock signals appearing on line 42 are also transmitted over line 46 to both inputs of a 74S38 OR gate 48. The output signal of gate 48 is connected over line 50 to a node 52 to which is connected an RC delay circuit generally indicated by the numeral 53 comprising a 680 ohm resistor 54 connected to a Vcc power source and a 180 pf capacitor 56 connected to ground. The time delay of the falling edge of the input clock signals appearing on line 42 with respect to the falling edge of the clock signals outputted by the Schmitt trigger circuit 44 is determined by the charging rate of the capacitor 56. This charging rate is continuously varied by the analog control signal 39 (FIG. 4) appearing on line 58 (FIG. 3) and outputted by the triangular wave generator 38.

The triangular wave generator 38 includes an LM311 comparator circuit 60 and an integrator circuit 62 comprising an ML1741 operational amplifier. The comparator circuit 60 compares the level of the output signal of the integrator circuit 62 appearing on line 64 with a reference signal developed by resistors 66 and 68 comprising a voltage divider circuit. The amplitude of the output signal of the comparator 60 appearing on line 72 is determined by resistors 74 and 76. The slope of the output waveform signal of the integrator circuit 62 is set by a resistor 78 and a capacitor 80. A capacitor 82 on line 58 prevents level changes of the delay circuit 36 from influencing the output signal of the triangular wave generator 38, while a resistor 84 in such line 58 influences the voltage level of the analog signal 39 (FIG. 4) outputted by the integrator circuit 62.

In the operation of the delay circuit 36, the clock signals appearing on the input line 42 (FIG. 3) to the inverter 40 will be inverted by the inverter 40 and applied to one input of the Schmidt trigger circuit 44. The clock signal will also be inputted to the OR gate 48. During the time the clock signal is high, the gate 48, being an open collector gate, discharges the capacitor 56 to ground and keeps the level of the output signal appearing on line 50 very close to ground. Since the level of the input signal on line 50 is below the threshold value of the trigger circuit 44, the circuit 44 will output a high signal.

When the clock signal appearing at the input of the OR gate 48 goes low, the output signal of such gate 48 will allow the voltage signal output of the RC circuit 53 to rise. When the signal level reaches the threshold value of the trigger circuit 44, the output of the delay circuit 36 appearing on line 70 goes low because of the high signal appearing on the input line 86. The time it takes for the voltage output signal of the RC circuit 53 to reach the threshold value of the trigger circuit 44 is controlled by the $V_{cc}$ voltage level applied to one end of the resistor 54 and the output voltage level of the integrator circuit 62. In the present embodiment, the output signal of the generator 38 is a triangular-shaped waveform 39 (FIG. 4) which rises and falls linearly between 2.5 volts and 5.0 volts. The application of this varying voltage to node 52 (FIG. 3) varies the current level at which the capacitor 56 is charging, thus varying the time the output voltage of the RC circuit 53 takes to reach the threshold value of the trigger circuit 44. This varying time period occurs only when the input signal appearing on line 42 is the falling edge of the clock signal. If the signal is the rising edge of a clock signal, the trigger circuit 44 will immediately output a high signal.

It will thus be seen that by introducing a variable delay in the propagation of the clock signals outputted by the oscillator 20, the frequency of the clock signals is changed, thus preventing the buildup of energy spikes in the system, which could produce undesirable RF emissions.

The integrated circuits which have been identified in this application are commercially available from Texas Instruments Corporation of Dallas, Texas.

Although only one exemplary embodiment of this invention has been described above, those skilled in the art will readily appreciate that many modifications of the circuitry and operation of the exemplary embodiment are possible without materially departing from the novel teachings and advantages of this invention.

We claim:

1. In combination with an oscillator for outputting clock signals of a predetermined frequency, an apparatus for reducing interference caused by electromagnetic radiation from said system at said predetermined frequency including delay means for outputting a delay signal for delaying the clock output of the oscillator and signal generator means for modulating the delay signal enabling said oscillator to output clock signals of varying frequencies, said oscillator includes an inverting gate member through which the clock signals are generated and said delay means includes a resistor-capacitor network connected to the input of said inverting gate member for outputting said delay signal which delays the timing of the clock signals outputted by the oscillator.

2. The apparatus of claim 1 in which said signal generating means is connected to said resistor-capacitor network and outputs an analog signal for modulating the delay signal outputted by the resistor-capacitor network.

3. The apparatus of claim 2 in which the delay means includes a trigger network connected to said resistor-capacitor network and operated by said delay signal to output a clock signal.

4. The apparatus of claim 3 in which said signal generating means comprises a triangular waveform signal generator for outputting a constantly changing linear waveform signal which modulates the delay signal of the resistor-capacitor network whereby the oscillator will output clock signals of varying frequency.

5. The apparatus of claim 4 in which the oscillator includes a plurality of control logic circuit members connected to the input of the resistor-capacitor network for disabling the operation of the oscillator when enabled.

* * * * *